United States Patent [19]

Fukukita et al.

[11] Patent Number: 5,311,870
[45] Date of Patent: May 17, 1994

[54] ULTRASONIC DOPPLER IMAGING APPARATUS

[75] Inventors: Hiroshi Fukukita, Tokyo; Hisashi Hagiwara, Yokohama; Morio Nishigaki, Kawasaki; Yasuhiro Nakamura, Yokohama, all of Japan

[73] Assignee: Matsushita Electric Industrial Co., Ltd., Osaka, Japan

[21] Appl. No.: 878,623

[22] Filed: May 5, 1992

[30] Foreign Application Priority Data

May 10, 1991 [JP] Japan .................................. 3-105479

[51] Int. Cl.⁵ ................................................ A61B 8/06
[52] U.S. Cl. ............................................... 128/661.09
[58] Field of Search ...................... 128/660.07, 661.10, 128/661.07–661.10; 364/768, 770

[56] References Cited

U.S. PATENT DOCUMENTS 5,065,764 11/1991 Nakamura et al. ............. 128/661.09

FOREIGN PATENT DOCUMENTS 0197854 10/1986 European Pat. Off. .
0228069 7/1987 European Pat. Off. .
57-128138 8/1982 Japan .
2144288 2/1985 United Kingdom .

OTHER PUBLICATIONS

Fathy F. Yassa, "Accurate Detection of Doppler Shifts and Frequency Modulation Using an Adaptive DSBSC-AM Detection Method", Record of the 23rd Asilomar Conference on Signals, Systems and Computers, Oct. 30, 1989, pp. 279-283.

Primary Examiner—Francis Jaworski
Attorney, Agent, or Firm—Stevens, Davis, Miller & Mosher

[57] ABSTRACT

An ultrasonic Doppler imaging apparatus emits ultrasonic pulse waves to an object body under test and provides information on blood flow in the body based on Doppler shifts of ultrasonic waves reflected back from the object body. The ultrasonic pulse waves emitted by a probe to the object body undergo Doppler shifts by being reflected by the blood stream, and the reflected ultrasonic waves received by the probe are decomposed with an A/D converter in synchronism with emission. The decomposed data are transformed into complex Doppler data through a quadrature addition/subtraction by quadrature addition/subtraction means. The complex Doppler data is subjected to frequency analysis through correlative computation or the like, and resulting data is stored in a frame memory and displayed. The apparatus is capable of measuring the Doppler shift frequency accurately.

16 Claims, 6 Drawing Sheets

ULTRASONIC DOPPLER IMAGING APPARATUS

BACKGROUND OF THE INVENTION

This invention relates to an ultrasonic Doppler imaging apparatus used for measuring the velocity of blood flow in the human body and the like on a real time basis.

There is known a method of ultrasonic pulse Doppler measurement in which ultrasonic pulse waves are emitted to a blood vessel of human a body and reflected ultrasonic waves, that have been rendered Doppler shifts in dependence on the blood flow velocity, are detected to thereby obtain information on blood flow. Also known is an ultrasonic Doppler imaging apparatus in which the ultrasonic pulse Doppler measuring method is combined with the pulse reflection method for producing a tomographic image of a diagnostic object, such as the heart, through the emission of ultrasonic pulse waves to the object body and the detection of reflected ultrasonic pulse waves from the object body, so that the blood flow information and tomographic image (B-mode image) information are obtained by means of a single ultrasonic probe and the blood flow information modulated in color graphics is superimposed on the tomographic image on a real time basis. The above-mentioned ultrasonic Doppler imaging apparatus, which is disclosed in Japanese Patent Unexamined Publication No. 57-128138, is based on the principle of operation, which will be explained in the following.

Figure 1:
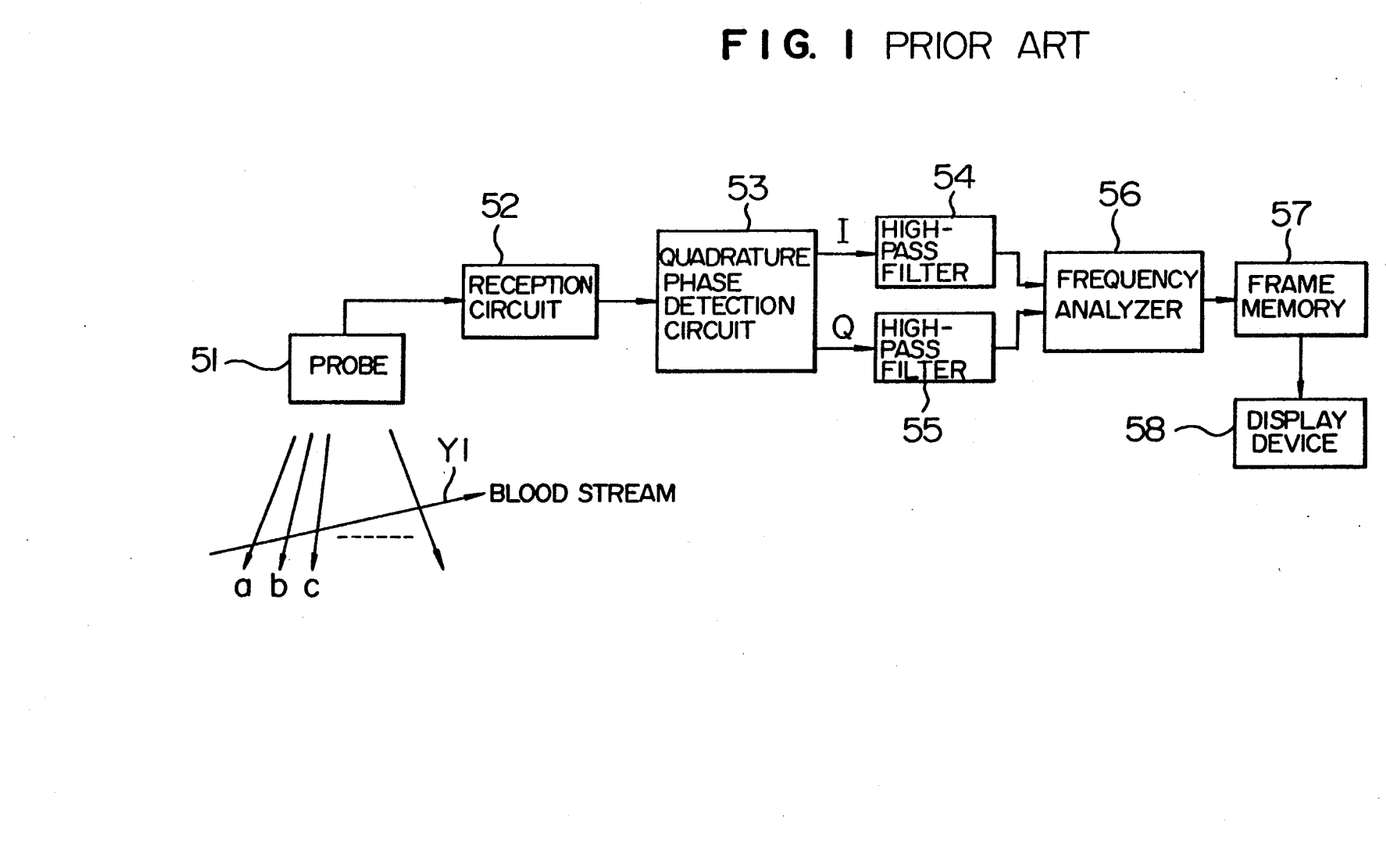
FIG. 1 is a block diagram showing in brief the conventional ultrasonic Doppler imaging apparatus.

FIG. 1 shows the basic principle and the arrangement of the conventional ultrasonic Doppler imaging apparatus. Symbol Y1 denotes a blood stream, and a, b and c denote emission directions of ultrasonic pulse waves to the blood stream Y1. Indicated by 51 is a probe which emits ultrasonic pulse waves to the blood stream Y1 and receives reflected ultrasonic pulse waves from the blood stream, 52 is a reception circuit which receives a ultrasonic pulse wave signal from the probe, 53 is a quadrature phase detection circuit which receives the output signal of the reception circuit and implements quadrature phase detection for the signal, 54 and 55 are high-pass filters, 56 is a frequency analyzer which receives the output signals of the high-pass filters and implements the frequency analysis for the signals, 57 is a frame memory which stores the output of the frequency analyzer, and 58 is a display device.

Next, the operation of the foregoing conventional apparatus will be explained. In FIG. 1, when an ultrasonic pulse wave is emitted to the blood stream Y1 in a live body under test, it is dispersed by flowing blood cells and the center frequency fc is shifted by a Doppler shift to vary by fd, resulting in a received frequency of f=fc+fd. The Doppler shift frequency fd is given by the following expression (1).

$$fd = 2V \cdot \cos(\theta) \cdot fc/c \qquad (1)$$

where V is the blood flow velocity, $\theta$ is the incident angle of the ultrasonic beam with the blood vessel, fc is the center frequency, and c is the velocity of sound.

Accordingly, the blood flow velocity V can be evaluated by detecting the Doppler shift frequency fd.

The blood flow velocity V is displayed as a two-dimensional image as follows. Initially, the ultrasonic probe 51 emits ultrasonic pulse waves in directions a, b, c, and so on sequentially toward the object body. At the beginning, ultrasonic pulse waves are emitted in the direction a several times, e.g., ten times. Each echo signal produced by Doppler shift reflection by the blood flow in the object body is received by the same probe 51, which converts the echo signal into an electric signal and delivers to the receiving circuit 52. Subsequently, the quadrature phase detection circuit 53 detects the I-channel and Q-channel Doppler shift signals as complex Doppler data. The Doppler shift signals are assessed on 256 sample points, for example, located in the emission direction of ultrasonic pulse waves.

Figure 2:
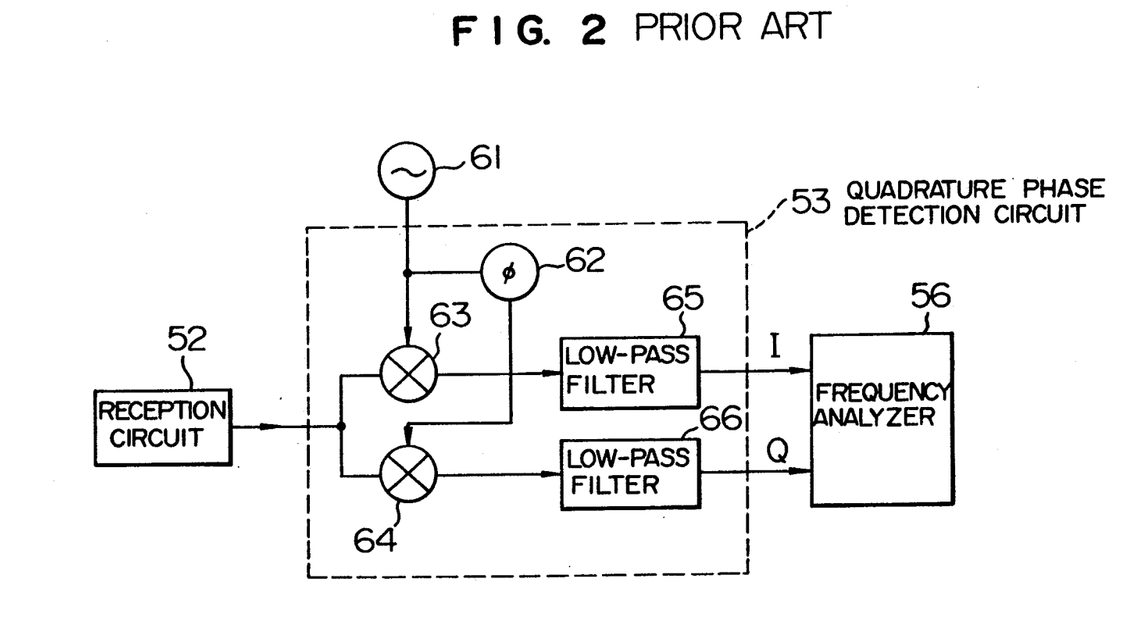
FIG. 2 is a block diagram showing in brief the quadrature phase detection circuit used in the apparatus of FIG. 1.

FIG. 2 shows the arrangement of the quadrature phase detection circuit 53. In the figure, indicated by 61 is an oscillator, 62 is a shifter, 63 and 64 are mixers, and 65 and 66 are low-pass filters. A signal provided by the reception circuit 52 is fed to the mixers. The mixer 63 mixes the received signal with a signal generated by the oscillator 61, and the mixer 64 mixes the received signal with the signal provided by the oscillator and phase-shifted by 90° by the shifter 62. The mixers 63 and 64 have their outputs fed through the low-pass filters 65 and 66, respectively, and the Doppler shift signals of the I and Q channels are detected.

Returning to FIG. 1, the Doppler shift signals at the same sample points, i.e., real parts and imaginary parts of ten elements of complex Doppler data resulting from ten emissions, have low-frequency component caused by the blood vessel wall and the like removed by means of the respective high-pass filters 54 and 55, and thereafter are fed to the frequency analyzer 56. The result of analysis is stored in the frame memory 57, and the images of the blood flow velocity component in the emission direction a are displayed on the display device 58.

The same operation is repeated for the emission directions b, c and so on, and blood flow images of all emission directions (flow velocity distribution images) are displayed on the display device 58. The flow velocity distribution images are displayed in color mode by being superimposed on a monochrome tomographic image.

However, the foregoing conventional ultrasonic Doppler imaging apparatus, which is based on the quadrature phase detection circuit 53 of analog circuit configuration, is deficient in the difficulty in the accurate balancing of the gain and phase of the I and Q channels, and therefore the accuracy of frequency analysis can be deteriorated due to unbalanced circuit parameters of both channels.

SUMMARY OF THE INVENTION

A prime object of the present invention is to provide an ultrasonic Doppler imaging apparatus which is not influenced by the error of an analog phase detection circuit and is capable of performing accurate frequency analysis.

Another object of this invention is to provide an ultrasonic Doppler imaging apparatus which is capable of measuring the Doppler frequency shift accurately through a reduced number of arithmetic operations.

Still another object of this invention is to provide an ultrasonic Doppler imaging apparatus which is capable of displaying the blood flow information and tomographic image accurately on the same frame of picture.

Still another object of this invention is to provide an ultrasonic Doppler imaging apparatus which is based on a quadrature adder/subtracter of digital configuration so that the gain and phase of the I and Q channels are maintained accurately.

In order to achieve the above objectives, an inventive ultrasonic Doppler imaging apparatus comprises means for decomposing the received signal in synchronism with emission, means for implementing the quadrature addition/subtraction for the decomposed data string, and frequency analysis means for implementing the correlative computation for the complex Doppler data produced as the I and Q channel outputs of computation. In consequence, both channels have their gain and phase balanced correctly, and the blood flow velocity can be evaluated accurately.

The quadrature adder/subtracter is designed to produce the I and q channel outputs through the subtraction between data elements, which are half phase apart, of the decomposed data string and thereafter through the summation of the results of subtraction. Addition/subtraction is implemented with addition/subtraction means for the decomposed data string and the data string delayed with delay means, and results are summed with cumulative summing means to thereby produce the I and Q channel outputs. In consequence, the Doppler shift frequency can be measured accurately through a reduced number of quadrature adding/subtracting operations.

DESCRIPTION OF THE PREFERRED EMBODIMENTS

Figure 3:
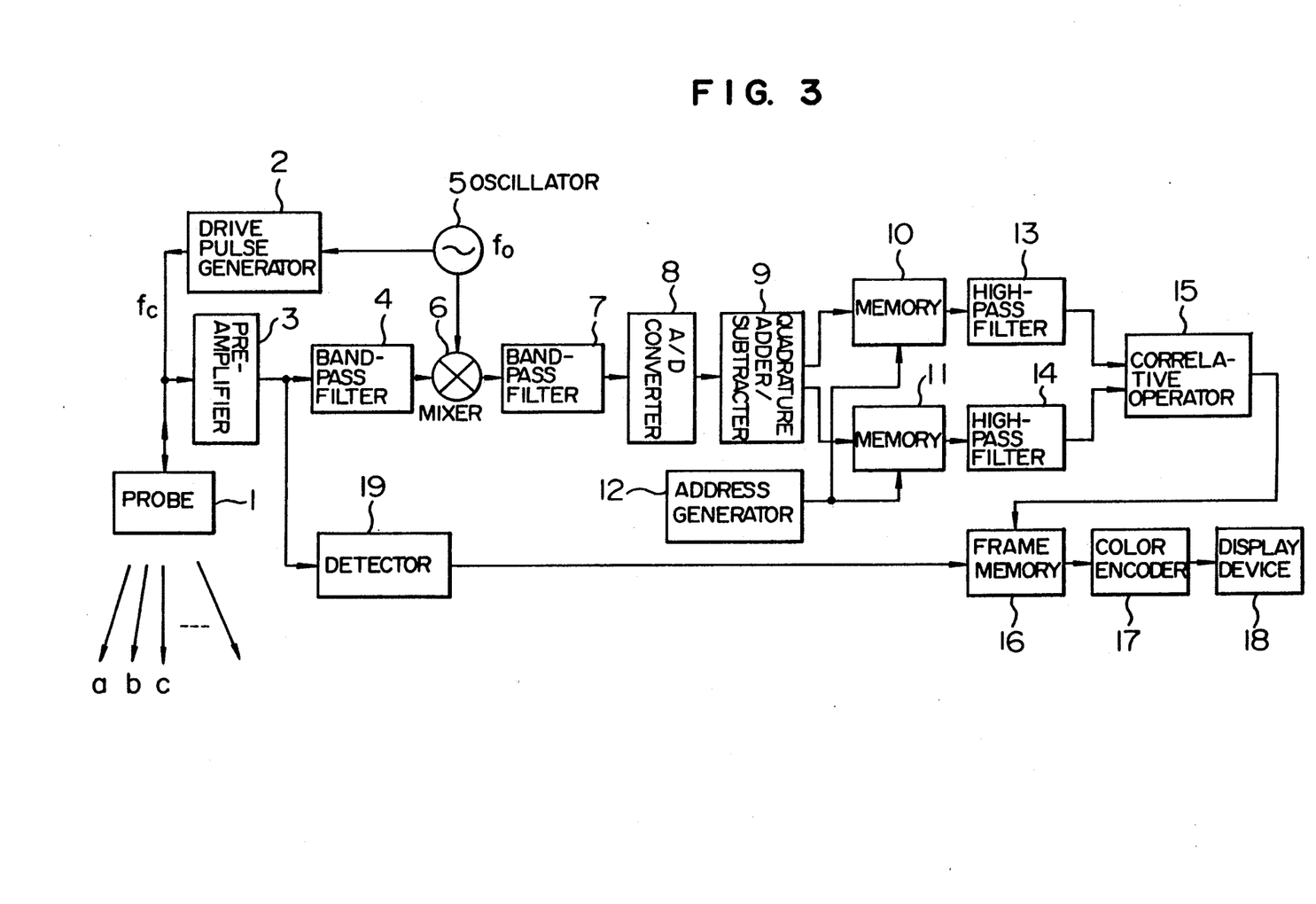
FIG. 3 is a block diagram showing in brief the ultrasonic Doppler imaging apparatus based on the first embodiment of this invention.

FIG. 3 shows the arrangement of the apparatus based on the first embodiment of this invention. In the figure, indicated by 1 is an ultrasonic probe ("probe" hereinafter), 2 is a pulse generator which activates the probe 1, 3 is a preamplifier which amplifies the electric signal produced from a reflected ultrasonic wave by the probe, 4 is a band-pass filter, and 5 is an oscillator which supplies a signal to the drive pulse generator 2 and a mixer 6 which mixes the output of the oscillator 5 with the output of the band-pass filter 4.

Indicated by 7 is a band-pass filter which extracts prescribed frequency components from the mixer output, 8 is an A/D converter which converts the analog output of the band-pass filter 7 into digital data, 9 is a quadrature adder/subtracter which converts the A/D converter output into complex Doppler data through the addition/subtraction operation, 10 and 11 are memories for storing the output of the quadrature adder/subtracter, 12 is an address generator which generates addresses for the memories, 13 and 14 are high-pass filters which extract high-frequency components from the outputs of the memories, 15 is a correlative operator which implements the frequency analysis for the outputs of the high-pass filters, 16 is a frame memory, 17 is a color encoder, 18 is a display device, and 19 is a detector which implements the detection for the preamplifier output and delivers the detection result to the frame memory.

Next, the operation of the first embodiment arranged as described above will be explained. In FIG. 3, the probe 1 is activated by the drive pulse generator 2, and it emits ultrasonic pulse waves in directions indicated by a, b, c and so on sequentially toward the object body, i.e., it implements the sector scanning.

The ultrasonic pulse wave transmitted has a center frequency of fc, and an ultrasonic pulse wave is emitted several times, e.g., ten times, in the direction of a at the beginning. Through the first emission and reception of an ultrasonic pulse wave in the a direction, an ultrasonic signal which has been rendered a Doppler shift by being reflected by the blood stream in the object body is received by the same probe 1, and the resulting electric signal is sent for amplification to the preamplifier 3 which serves as the reception circuit.

The output signal of the preamplifier 3 is detected by the detector 19, and the resulting tomographic image signal of the object body is stored in the frame memory 16. The monochrome tomographic image is displayed on the display device 18. The output of the preamplifier 3 is, at the same time, received by the band-pass filter 4, by which prescribed frequency components are extracted, and thereafter it is rendered the frequency conversion by being mixed with the output of the oscillator 5 by the mixer 6.

The oscillator 5, which operates in synchronism with the drive pulse generator 2, has its output mixed with the output of the band-pass filter 4 by the mixer 6. The oscillation frequency fo is chosen so that the mixer output frequency fi (fi=fc−fo) is about 1 MHz. The band-pass filter 7 removes unwanted frequency components from the mixer output. The output of the band-pass filter 7 is converted into digital data in synchronism with emission by the A/D converter 8 which operates in synchronism with the oscillator 5. The A/D converter used here has a resolution of 12 bits and a sampling frequency of about fi×4.

The resulting digital data is converted into complex Doppler data of I and q channels by the quadrature adder/subtracter 9 as follows.

It is assumed that the quadrature adder/subtracter 9 is supplied with data Di (1≦i%≦n) from the A/D converter 8. The quadrature adder/subtracter produces complex Doppler data for a set of K, e.g., four, consecutive data elements. For the four data pieces D1, D2, D3 and D4, the resulting complex Doppler data has its real part R and imaginary part X expressed as follows.

$$R = D1 - D3 \quad (2)$$

$$X = D2 - D4 \quad (3)$$

For a series of data Di sent successively from the A/D converter 8, a set of four data pieces is selected, and complex Doppler data R and X are evaluated through the quadrature adding/subtracting operation as follows.

For selected data D2, D3, D4 and D5: R=−D3+D5, X=D2−D4.

For selected data D3, D4, D5 and D6: R=−D3+D5, X=−D4+D6.

This relationship is generalized for selected data $D_i$, $D_{i+1}$, $D_{i+2}$ and $D_{i+3}$ (where i is an odd number) as follows.

$$R = C_i \cdot D_i + C_{i+2} \cdot D_{i+2} \quad (4)$$

$$X = C_i \cdot D_{i+1} + C_{i+2} \cdot D_{i+3} \quad (5)$$

$$C_i = (-1)^{i/2} \text{ (i/2: integer operation)} \quad (6)$$

Similar expressions are found for an even number of i.

$$R = C_i \cdot D_{1+1} + C_{i+2} \cdot D_{i+3} \quad (7)$$

$$X = C_i \cdot D_{1+1} - C_{1+2} \cdot D_{i+3} \quad (8)$$

$$C_i = (-1)^{i/2} \text{ (i/2: integer operation)}$$

The expressions (4) and (5) reveal that the period of addition/subtraction has a shift of one data element between these expressions, and this shift value is a quarter period (90°) with respect to a complete period (360°) of four consecutive data elements, and on this account the foregoing adding/subtracting operation is called "quadrature addition/subtraction". The complex Doppler data R and X, which correspond to the analog quadrature phase detection output, are evaluated through the digital computation.

Complex Doppler data obtained for all sample points, e.g., 256 points, in the emission direction a are stored in the memories 10 and 11. The memories store the complex Doppler data resulting from a series of emissions, i.e., ten emissions, in the direction a.

Subsequently, complex Doppler data for each sample point of the same depth are read out of the memories 10 and 11 as a string of ten data elements. The memories are controlled for writing and reading by the address generator 12. The read-out data string has low-frequency components caused by the blood vessel wall and the like removed by means of the high-pass filters 13 and 14, and the Doppler shift signal pertinent to blood flow is extracted.

The correlative operator 15 uses the outputs of the high-pass filters 13 and 14 to calculate the average frequency, i.e., the Doppler shift frequency fd, and its polarity. The Doppler shift frequency fd represents the blood flow velocity V as shown by the expression (1), and the polarity represents the direction of blood flow. The average frequency is assessed based on the autocorrelation in general, and an alternative method among various other methods is based on the discrete Fourier transformation for obtaining the first-order moment of the frequency from the power spectrum.

The values of Doppler shift frequency fd or blood flow velocity V evaluated by the correlative operator 15 for all sample points in the emission direction a of ultrasonic pulse waves are stored in the frame memory 16. The same operation is repeated for the remaining emission directions b, c, and so on of ultrasonic pulse waves, and blood flow images (flow velocity distribution images) are produced for the individual emission directions.

The output of the detector 19 is also stored in the frame memory 16 for producing a tomographic image, as mentioned previously. The color encoder 17 appends color information to the blood flow image data read out of the frame memory 16, and the resulting images are displayed on the display device 18. Consequently, the display device 18 displays, by superimposition, the monochrome tomographic image and the color blood flow images, whereby the doctor's diagnosis is made more accurate and easier.

Figure 4:
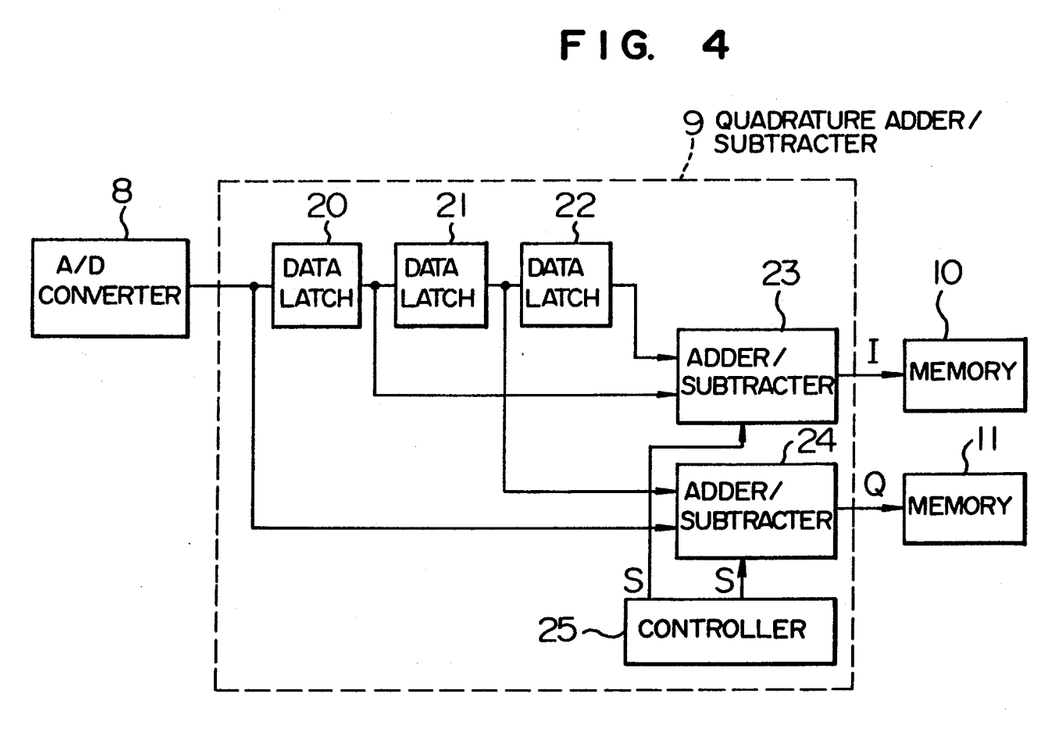
FIG. 4 is a block diagram showing in detail the first embodiment of the quadrature adder/subtracter used in the apparatus.

FIG. 4 is a block diagram showing the arrangement of the first embodiment of the quadrature adder/subtracter 9 shown in FIG. 3. In the figure, indicated by 20 is a data latch which holds the output of the A/D converter 8, 21 is a data latch which holds the output of the data latch 20, 22 is a data latch which holds the output of the data latch 21, 23 is an adder/subtracter which implements subtraction for the outputs of the data latches 20 and 22, 24 is an adder/subtracter which implements subtraction for the outputs of the A/D converter 8 and data latch 21, and 25 is a controller.

Next, the operation of this quadrature adder/subtracter 9 will be explained. An output data string Di provided by the A/D converter 8 is latched into the data latches 20, 21 and 22 sequentially in response to each event j of latch clock. Thus, at a clock event j, the data latch 20 has input data Dj+3 and output data Dj+2, the data latch 21 has output data Dj+1, and the data latch 22 has output data Dj.

In this operation, the controller 25 issues operational commands S to the adder/subtracters 23 and 24 such that the I-channel output of the adder/subtracter 23 is equal to the right side of expression (4) and the Q-channel output of the adder/subtracter 24 is equal to the right side of expression (5). As a result of this operation, the quadrature adder/subtracter 9 produces complex Doppler data R and X as a Doppler shift signal through the digital computation.

Accordingly, the quadrature adder/subtracter of the first embodiment evaluates the complex Doppler data R and X as a Doppler shift signal for a data string converted from the received signal by the A/D converter 8, and it can balance the gain and phase of both channels accurately and enables high-accuracy measurement of the Doppler shift frequency.

Figure 5:
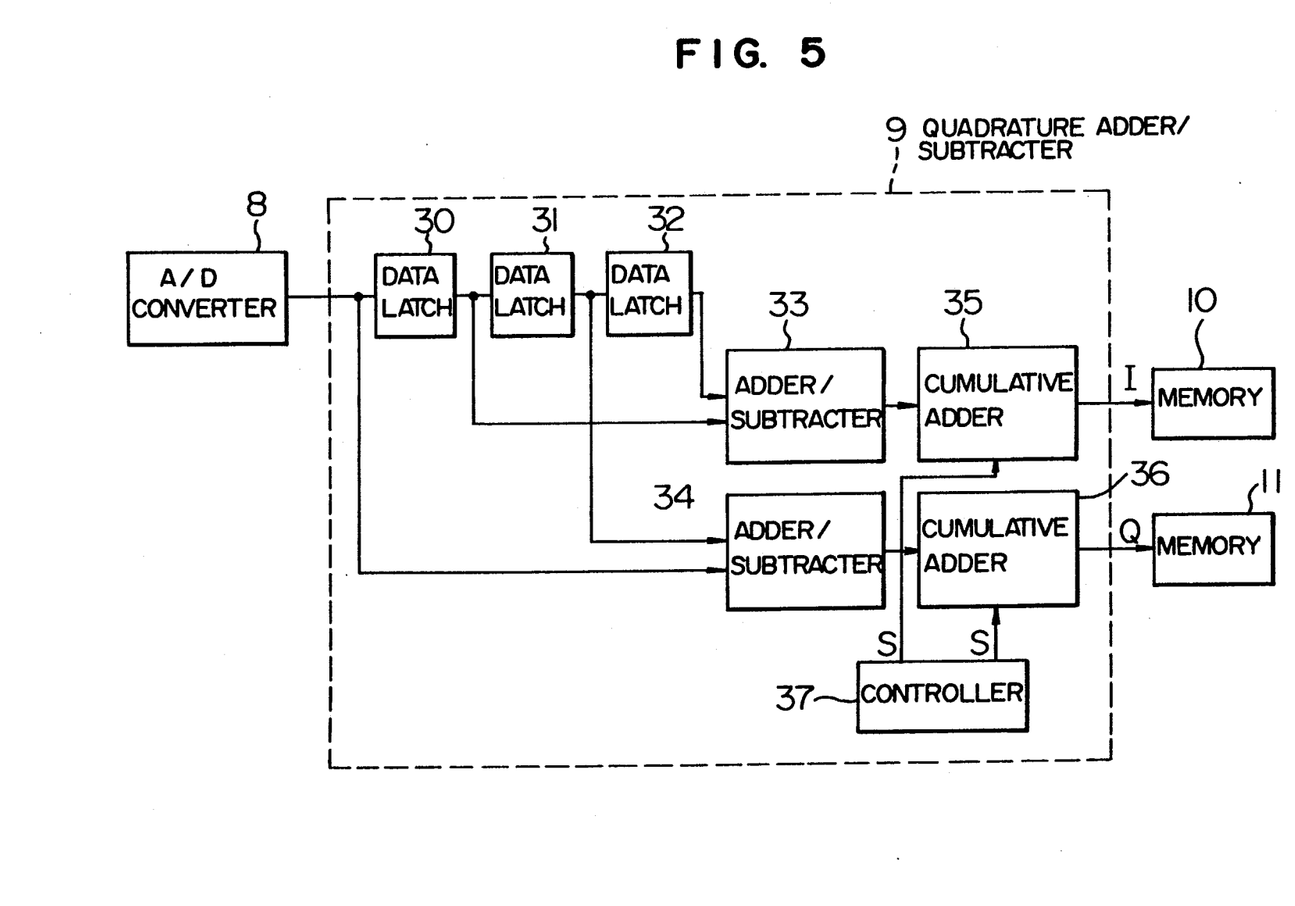
FIG. 5 is a block diagram showing in detail the second embodiment of the quadrature adder/subtracter used in the apparatus.

FIG. 5 is a block diagram showing the arrangement of the second embodiment of the quadrature adder/subtracter 9. In the figure, indicated by 30 is a data latch which holds the output of the A/D converter 8, 31 is a data latch which holds the output of the data latch 30, 32 is a data latch which holds the output of the data latch 31, 33 is an adder/subtracter which implements subtraction for the outputs of the data latches 30 and 32, 34 is an adder/subtracter which implements subtraction for the outputs of the A/D converter 8 and data latch 31, 35 is a cumulative adder which implements cumulative summation for the outputs of the adder/subtracter 33 and delivers the result to a memory 10, 36 is a cumulative adder which implements cumulative summation for the outputs of the adder/subtracter 34 and delivers the result to a memory 11, and 37 is a controller which issues operational commands S to the cumulative adders.

Next, the operation of this quadrature adder/subtracter 9 will be explained. An output data string Di provided by the A/D converter 8 is latched into the data latches 30, 31 and 32 sequentially in response to each event j of latch clock. Thus at a clock event j, the data latch 30 has input data Dj+3 and output data Dj+2, the data latch 31 has output data Dj+1, and the data latch 32 has output data Dj. At a clock event j=1, the adder/subtracter 33 has an output A=D1 −D3, and the adder/subtracter 34 has an output B=D2−D4. With the interval between data D1 and D5 being defined to be one period, the interval between D1 and D3 and between D2 and D4 is equal to a half period (½ phase). At a clock event j=5, the adder/subtracter 33 has an output A=D5−D7, and the adder/subtracter 34 has an output B=D6−D8.

The controller 37 issues the operational commands S so that the cumulative adders 35 and 36 sum the outputs of the adder/subtracters 33 and 34 at clock events j=1 and j=5, and consequently the cumulative adder 35 produces an output of D1−D3+D5−D7, and the cumulative adder 36 produces an output of D2−D4+D6−D8. In this manner, complex Doppler data can be obtained for any data Di (1≦j≦n, where n>4). The cumulative adders 35 and 36 have their operation controlled for each clock event j by the operational commands S issued by the controller 37.

Accordingly, the quadrature adder/subtracter of the second embodiment evaluates the complex Doppler data R and X as a Doppler shift signal for a data string converted from the received signal by the A/D converter 8 through the subtraction between data which are ½ phase apart and the summation for the results of subtraction, and it can balance the gain and phase of both channels accurately and enables high-accuracy measurement of the Doppler shift frequency through a less number of adding/ subtracting operations.

Figure 6:
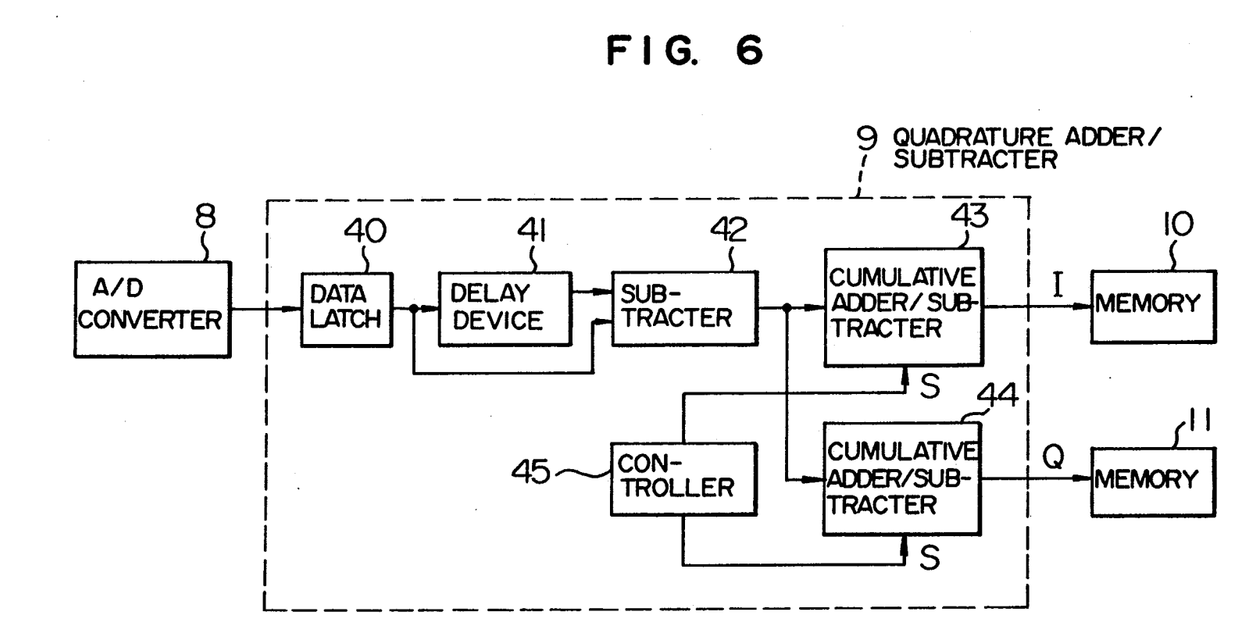
FIG. 6 is a block diagram showing in detail the third embodiment of the quadrature adder/subtracter used in the apparatus.

FIG. 6 is a block diagram showing the arrangement of the third embodiment of the quadrature adder/ subtracter 9. In the figure, indicated by 40 is a data latch which holds the output of the A/D converter 8, 41 is a data delay device which delays the output of the data latch 40, 42 is a subtracter which implements subtraction for the outputs of the data latch 40 and data delay device 41, 43 and 44 are cumulative adder/subtracters which implement cumulative summation/subtraction for the outputs of the subtracter 42 and deliver the results to memories 10 and 11, and 45 is a controller which issues operational commands S.

Next, the operation of this quadrature adder/ subtracter 9 will be explained. An output data string Di provided by the A/D converter 8 is latched into the data latch 40 in response to each event j of latch clock. The data delay device 41 has its delay time set equal to k latch clock periods. At a clock event j+k, the data delay device produces output data Dj for input data Dj+k, and the subtracter 42 produces an output of Δj+k=Dj+k−Dj.

The operation of the quadrature adder/subtracter 9 will be explained for the example of k=4. At the initial clock event j=0, the data delay device 41 and cumulative adder/subtracters 43 and 44 are cleared. The input G and output H of the data delay device 41, the output Δ of the subtracter 42, the output A of the cumulative adder/subtracter 43, and the output B of the cumulative adder/subtracter 44 at each successive clock event are expressed as follows.

---
j = 1: G = D1, H = 0, Δ = D1, A = D1, B = 0
j = 2: G = D2, H = 0, Δ = D2, A = D1, B = D2
j = 3: G = D3, H = 0, Δ = D3, A = D1−D3, B = D2
j = 4: G = D4, H = 0, Δ = D4, A = D1−D3, B = D2−D4
j = 5: G = D5, H = D1, Δ = D5 − D1,
       A = D1−D3 + (D5 − D1) = −D3 + D5, B = D2−D4
j = 6: G = D6, H = D2, Δ = D6 − D2,
       A = −D3 + D5, B = D2−D4 + (D6 − D2) = −D4 + D6
---

The cumulative adder/subtracters 43 and 44 have their adding or subtracting operation for the output Δ of subtracter 42 selected in response to the operational command S from the controller 45.

In this manner, the adder/subtracter 43 produces outputs which match the values R of expression (4) and the adder/subtracter 44 produces outputs which match the values of X of expression (5) at successive clock events.

Accordingly, the third embodiment of quadrature adder/subtracter 9, which is formed of the data delay device 41, subtracter 42 and cumulative adder/subtracters 43 and 44, evaluates the complex Doppler data R and X as a Doppler shift signal for a data string converted from the received signal by the A/D converter 8, and it can balance the gain and phase of both channels accurately and enables high-accuracy measurement of the Doppler shift frequency through a reduced number of adding/subtracting operations.

What is claimed is:

1. An ultrasonic Doppler analysis and display apparatus comprising:
   ultrasonic means for emitting ultrasonic pulse waves to an object body under test and receiving dispersed ultrasonic wave signals dispersed from said object body;
   means for A/D converting, in synchronism with said ultrasonic means, said dispersed ultrasonic wave signals and outputting a data string;
   computing means, receiving said data string, for performing a quadrature addition/subtraction operation on a selected set of data elements including $D_i$, $D_{i+1}$, $D_{i+2}$, and $D_{i+3}$ selected from said data string to obtain complex Doppler data having a real part R and an imaginary part X expressed by, where i is an odd number, $$R = C_i \cdot D_i + C_{i+2} \cdot D_{i+2}$$

$$X = C_i \cdot D_{i+1} + C_{i+2} \cdot D_{i+3}, \text{ and}$$

expressed by, where i is an even number, $$R = C_i \cdot D_{i+1} + C_{i+2} \cdot D_{i+3}$$

$$X = C_i \cdot D_i - C_{i+2} \cdot D_{i+2}$$

where $C_i = (-1)^{i/2}$, and i/2 is an integer operation,
   wherein the addition/subtraction operation for the real part R and the imaginary part X have a quadrature relation;
   means for implementing frequency analysis of said complex Doppler data provided by said computation means; and
   means for displaying a result of said frequency analysis.

2. An ultrasonic Doppler analysis and display apparatus according to claim 1, wherein said computation means comprises a plurality of data latches, connected in series, for sequentially shifting said data string by ¼ phase, and a pair of subtraction means for implementing subtraction between said data elements, which are ½ phase apart, said data elements being derived from said data string and outputs of said data latches.

3. An ultrasonic Doppler analysis and display apparatus according to claim 1, wherein said computation means comprises means for implementing subtraction between data elements which are ½ phase apart, and means for summing results of said subtraction.

4. An ultrasonic Doppler analysis and display apparatus according to claim 1, wherein said computation means comprises delay means for delaying the A/D converted digital data string; means for implementing addition/subtraction between input and output data of said delay means; and means for implementing a cumulative summation of outputs of said addition/subtraction means.

5. An ultrasonic Doppler imaging apparatus comprising:
   ultrasonic means for emitting ultrasonic pulse waves to an object body under test in a selective-scanning manner and receiving dispersed ultrasonic waves dispersed for said object body;
   means for A/D converting, in synchronism with said ultrasonic means, a first part of said dispersed ultrasonic wave signals into digital data and outputting a digital data string;
   addition/subtraction means, receiving said data string from said A/D converting means, for performing a quadrature addition/subtraction operation on a selected set of data elements including $D_i$, $D_{i+1}$, $D_{i+2}$, and $D_{i+3}$ selected from said data string to obtain complex Doppler data having a real part R and an imaginary part X expressed by, where i is an odd number:

$$R = C_i \cdot D_i + C_{i+2} \cdot D_{i+2}$$

$$X = C_i \cdot D_{i+1} + C_{i+2} \cdot D_{i+3}, \text{ and}$$

expressed by, where i is an even number:

$$R = C_i \cdot D_{i+1} + C_{i+2} \cdot D_{i+3}$$

$$X = C_i \cdot D_i - C_{i+2} \cdot D_{i+2}$$

where, $C_i = (-1)^{i/2}$, and i/2 is an integer operation,
   wherein said addition/subtraction operation for the real part R and the imaginary part X have a quadrature relation;
   means for implementing frequency analysis for said complex Doppler data provided by said addition/subtraction means to obtain a Doppler shift frequency;
   means for detecting a second part of said dispersed ultrasonic wave signals to obtain a tomographic image signal of said object body; and
   display means for displaying the output of said frequency analysis means and the output of said detection means as one picture frame.

6. An ultrasonic Doppler imaging apparatus according to claim 5, further comprising a high-pass filter connected to said addition/subtraction means, wherein the output of said addition/subtraction means is subjected to the frequency analysis after low-frequency components thereof have been removed by said high-pass filter.

7. An ultrasonic Doppler imaging apparatus according to claim 5, wherein said addition/subtraction means comprises means for selecting, from said data string, a set of data elements including four elements of data which are sequentially shifted by ¼ phase relative to each other, and a pair of subtraction means, each for implementing subtraction between data elements of said four elements which are ½ phase apart, wherein outputs of said pair of subtraction means have a quadrature relation with each other.

8. An ultrasonic Doppler imaging apparatus according to claim 5, wherein said addition/subtraction means comprises delay means for delaying said digital data string, provided by said A/D converting means, by a predetermined time period to provide a delayed digital data string, means for implementing subtraction between said digital data string and said delayed digital data string, and a pair of cumulative summing means for alternately implementing cumulative summation of results of subtraction of said addition/subtraction means with outputs of said cumulative summing means in an quadrature relation.

9. An ultrasonic Doppler imaging apparatus according to claim 5, wherein said display means comprises a color encoder so as to only display the output of said frequency analysis means in a color mode and said display means displays the output of said detection means in a monochrome mode.

10. An ultrasonic Doppler imaging apparatus according to claim 5, wherein said frequency analysis means comprises an autocorrelation computation device.

11. A quadrature addition/subtraction device comprising:
   latch clock means for generating a latch clock;
   input means for receiving digital data;
   a plurality of latch means, connected in series, for sequentially latching elements of said digital data so as to shift a phase thereof, in accordance with said latch clock;
   first addition/subtraction means for implementing addition/subtraction between two first data elements, which are ½ period apart from each other, said two first data elements being selected from digital elements appearing at said input means and at outputs of said plurality of latch means;
   second addition/subtraction means for implementing addition/subtraction between two second data elements, selected from said digital data elements appearing at said input means and at said outputs of said plurality of latch means, said two second data elements being ¼ period apart from said two first data elements, respectively;
   wherein said two first data elements respectively have a quadrature relation with corresponding ones of said two second digital elements; and
   control means for controlling the adding/subtracting operation of said first and second addition/subtraction means.

12. A quadrature addition/subtraction device according to claim 11, wherein said plurality of latch means comprise three data latches so that the phase of an element of digital data is shifted by each of said three data latches by a ¼ period.

13. A quadrature addition/subtraction device comprising
   latch clock means for generating a latch clock;
   input means for receiving digital data;
   a plurality of latch means, connected in series, for sequentially latching elements of said digital data supplied thereto so as to shift a phase thereof in accordance with said latch clock;
   first addition/subtraction means for implementing addition/ subtraction between two first data elements, which are ½ period apart, selected from elements of digital data appearing at said input means and at outputs of said plurality of latch means;

second addition/subtraction means for implementing addition/subtraction between two second data elements, selected from said digital data elements appearing at said input means and at said outputs of said plurality of latch means, said two second data elements being ¼ period apart from said two first data elements, respectively;

wherein said two first data elements have a respective quadrature relation with corresponding ones of said two second data pieces;

first cumulative summing means for cumulatively summing outputs of said first addition/subtraction means;

second cumulative summing means for cumulatively summing outputs of said second addition/subtraction means; and control means for controlling the adding/subtracting operation of said first and second cumulative summing means.

14. A quadrature addition/subtraction device according to claim 13, wherein said plurality of latch means comprise three data latches so that the phase of elements of digital data is shifted by each of said three data latches by a ¼ period.

15. A quadrature addition/subtraction device comprising:

latch clock means for generating a latch clock;

input means for receiving digital data;

latch means, responsive to the latch clock, for latching said digital data supplied thereto by said input means;

delay means for delaying an output of said latch means;

subtraction means for implementing subtraction between an output of said latch means and an output of said delay means;

first and second cumulative addition/subtraction means for alternately implementing cumulative addition/subtraction for outputs of said subtraction means; and control means for controlling the adding/subtracting operation of said first and second cumulative addition/ subtraction.

16. A quadrature addition/subtraction device according to claim 15, wherein said delay means has a delay period equal to a time width of a plurality of elements of said digital data.

* * * * *